United States Patent
Ho et al.

(10) Patent No.: US 7,218,400 B2
(45) Date of Patent: May 15, 2007

(54) IN-SITU OVERLAY ALIGNMENT

(75) Inventors: Grace H. Ho, Tainan (TW); Ming-Che Wu, Chia-Yi (TW); Li-Heng Chou, Kaohsiung (TW); Hung-Chang Hsieh, Hsinchu (TW); Jung Ting Chen, Tao Yuan (TW); Yao-Ching Ku, Hsin-Chu (TW)

(73) Assignee: Taiwan Semiconductor Manufacturing Company Ltd., Hsin-Chu (TW)

( * ) Notice: Subject to any disclaimer, the term of this patent is extended or adjusted under 35 U.S.C. 154(b) by 412 days.

(21) Appl. No.: 10/792,147

(22) Filed: Mar. 3, 2004

(65) Prior Publication Data

US 2005/0195397 A1    Sep. 8, 2005

(51) Int. Cl.
*G01B 11/00* (2006.01)

(52) U.S. Cl. ................ 356/401; 257/757; 430/5; 430/30; 430/22

(58) Field of Classification Search ............... 356/400, 356/401; 430/22, 311; 257/797; 438/401
See application file for complete search history.

(56) References Cited

U.S. PATENT DOCUMENTS

| 6,638,671 | B2 * | 10/2003 | Ausschnitt et al. | ........... 430/22 |
| 6,828,071 | B2 * | 12/2004 | Nin | .............. 430/22 |
| 6,906,780 | B1 * | 6/2005 | Smith | ........... 355/52 |
| 6,975,974 | B2 * | 12/2005 | Chien et al. | ............ 703/2 |
| 7,006,225 | B2 * | 2/2006 | Tanaka | ........... 356/401 |

* cited by examiner

*Primary Examiner*—Layla G. Lauchman
(74) *Attorney, Agent, or Firm*—Tung & Associates

(57) ABSTRACT

A semiconductor wafer is disclosed that includes a plurality of fields, including a plurality of alignment fields. Each alignment field includes a plurality of intra-field small scribe lane primary mark (SSPM) overlay mark pairs there around. The SSPM mark pairs allow for in-situ, non-passive intra-field alignment correction. In one embodiment, there may be between two and four alignment fields, and between two and four SSPM mark pairs around each alignment field. The SSPM marks of each mark pair may be extra scribe-lane marks.

12 Claims, 3 Drawing Sheets

IN-SITU OVERLAY ALIGNMENT

FIELD OF THE INVENTION

This invention relates generally to semiconductor processing, and more specifically to overlay alignment within photolithography as may be performed within such semiconductor processing.

BACKGROUND OF THE INVENTION

Deposition and patterning are two of the basic steps performed in semiconductor processing. Patterning is also referred to as photolithography, masking, oxide or metal removal, and microlithography. Patterning enables the selective removal of material deposited on a semiconductor substrate, or wafer, as a result of deposition. Alignment is critical in photo-lithography and deposition, as well as in other semiconductor processes. If layers are not deposited properly, or if they are not selectively removed properly, the resulting semiconductor devices may not function, relegating them to scrap, which can be costly. Therefore, alignment marks are placed on the semiconductor wafer for the proper positioning during the deposition and photolithography processes.

Alignment is especially critical where a number of layers have already been deposited on the wafer. Subsequent deposition of other layers in such instances usually requires that the alignment marks on the wafer be exposed for proper overlay of the silicon dioxide or other layers. Overlay accuracy within photolithography becomes more stringent as the critical dimensions (CD's) and other dimensions of the semiconductor designs become smaller and smaller.

Currently, the control of overlay alignment is accomplished by the alignment systems of scanners performing overlay corrections for inter-field overlay and reticle expansion, and feed-forward overlay corrections by the box-in-box overlay results of previous lots for any remaining inter- and intra-field errors. Examples of inter-field and intra-field errors are shown in FIGS. 1 and 2, respectively.

In FIG. 1, the inter-field overlay errors within the semiconductor wafer 100 are represented by the arrows 102. The arrows 102 represent inter-field overlay translation errors in both the x and y directions, wafer expansion errors in both the x and y directions, wafer rotation, and non-orthogonal errors. That is, the arrows 102 represent overlay errors between fields. In FIG. 2, the intra-field overlay errors within the wafer 200 are represented by the arrows 202. The arrows 202 represent intra-field overlay translation errors in both the x and y directions, reticle field rotation and reticle asymmetric field rotation errors, and reticle magnification and reticle asymmetric magnification errors. That is, the arrows 202 represent overlay errors within a field.

The disadvantage with current overlay alignment—that is, corrections by the alignment system of the scanners and feed-forward overlay corrections—is that there is no ability to perform in-situ, or in-place, overlay corrections for the intra-field wafer errors. The intra-field errors are corrected in a feed-forward process, which is a passive process. This can result in out-of-specification overlays, resulting in sometimes costly and time-consuming semiconductor rework.

Therefore, there is a need for performing in-situ overlay corrections, especially for intra-field semiconductor wafer errors. There is a need for such correction to be performed without having to resort to a feed-forward process. Such a new, in-situ, approach to overlay correction should result in a reduction of out-of-specification overlays, reducing costly and time-consuming semiconductor rework. For these and other reasons, there is a need for the present invention.

SUMMARY OF THE INVENTION

The invention relates to in-situ overlay alignment. A semiconductor wafer of the invention includes a plurality of fields, including a plurality of alignment fields. Each alignment field includes a plurality of intra-field small scribe lane primary mark (SSPM) overlay mark pairs there around. The SSPM mark pairs allow for in-situ, non-passive intra-field alignment correction. In one embodiment, there may be more than 1 field and between two and four SSPM mark pairs around each alignment field. The SSPM marks of each mark pair may be extra scribe-lane marks.

The invention provides for advantages over the prior art. Significantly, intra-field overlay errors on semiconductor wafers can be eliminated in an in-situ, non-passive manner. Such in-situ correction is less expensive and less time-consuming than the passive manner for correction of intra-field overlay errors accomplished within the prior art. The rework rate of wafers is thus decreased, improving semiconductor device yield. Still other advantages, embodiments, and aspects of the invention will become apparent by reading the detailed description that follows, and by referencing the attached drawings.

BRIEF DESCRIPTION OF THE DRAWINGS

The drawings referenced herein form a part of the specification. Features shown in the drawing are meant as illustrative of only some embodiments of the invention, and not of all embodiments of the invention, unless otherwise explicitly indicated, and implications to the contrary are otherwise not to be made.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Figure 1:
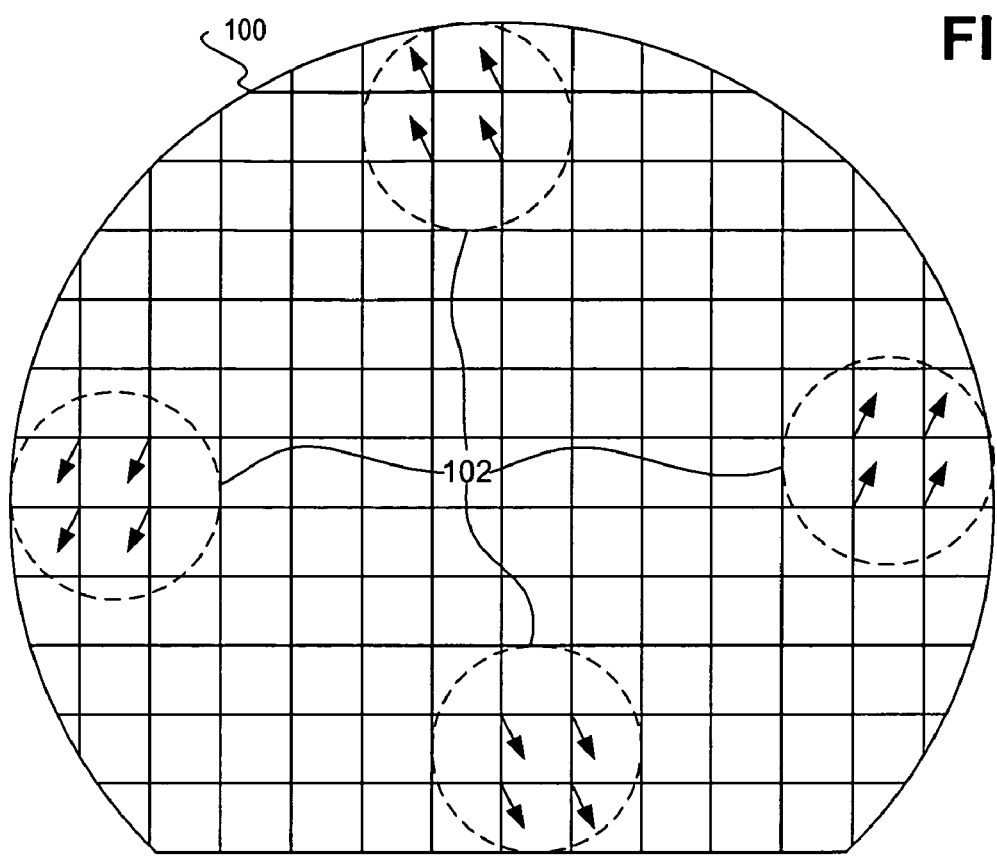
FIG. 1 is a diagram showing a representation of inter-field overlay alignment errors.
Figure 2:
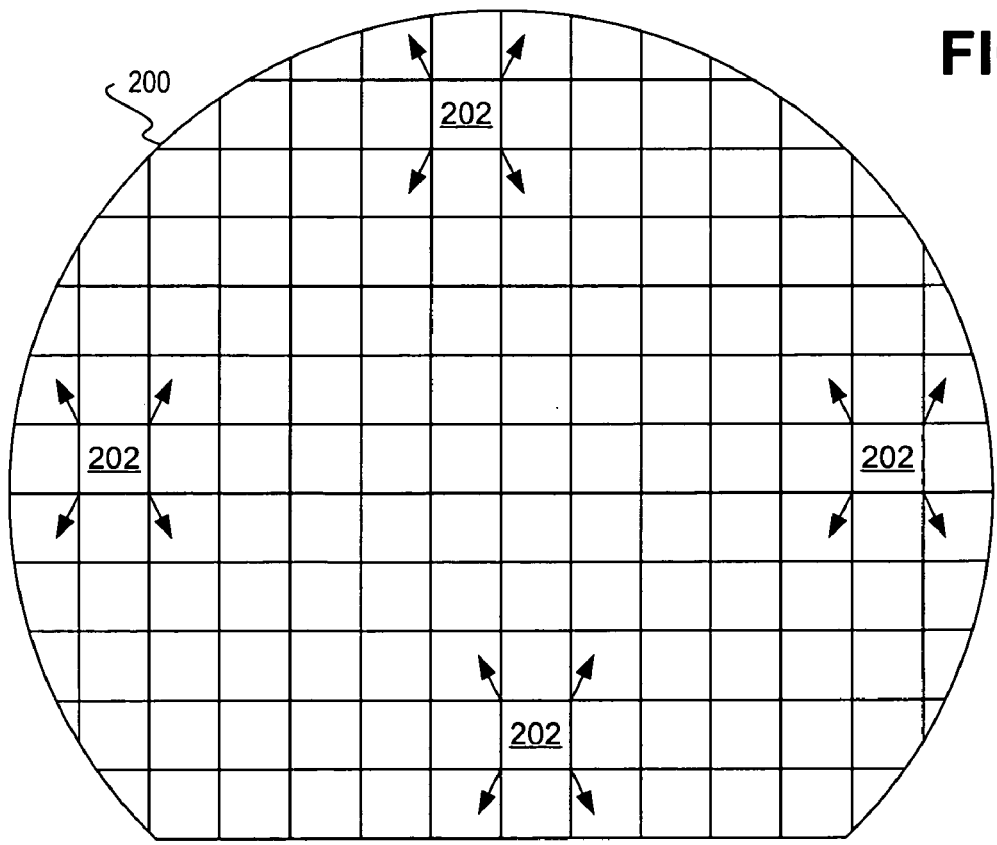
FIG. 2 is a diagram showing a representation of intra-field overlay alignment errors.
Figure 3:
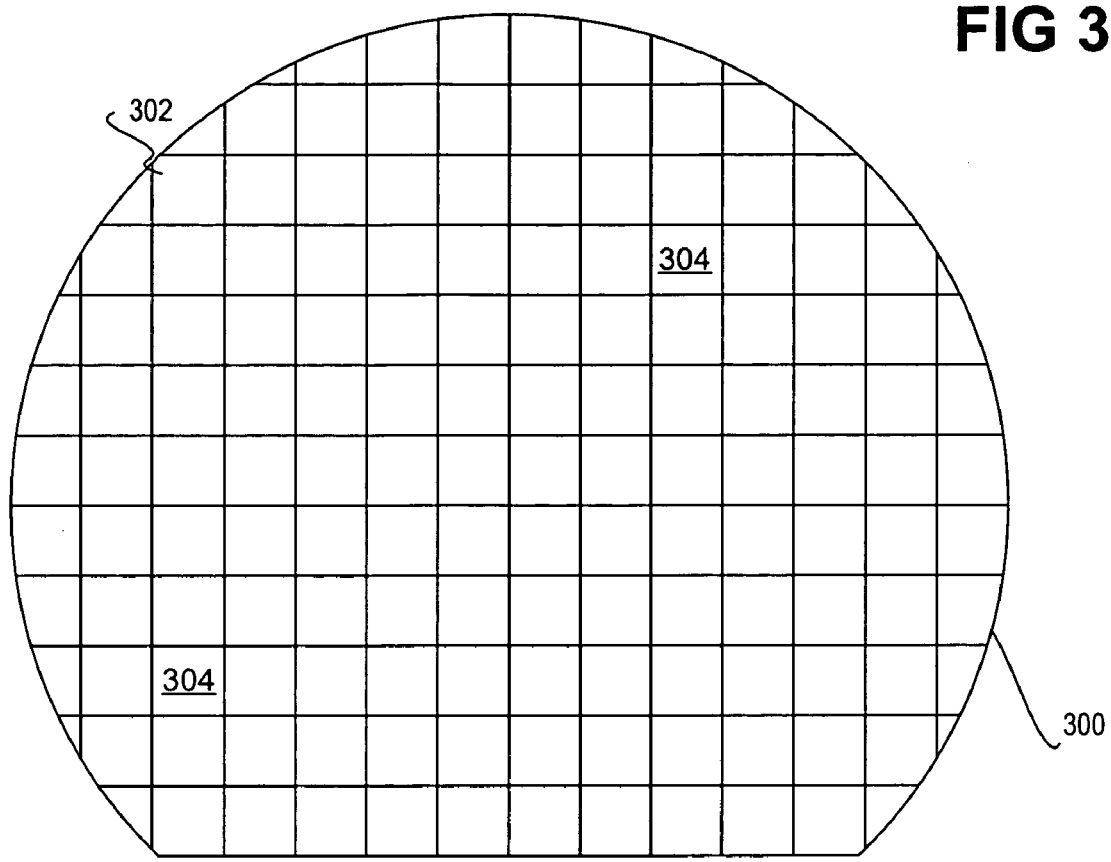
FIG. 3 is a diagram of a semiconductor wafer having a number of fields defined thereon, including a number of alignment fields, according to an embodiment of the invention.

FIG. 3 shows a semiconductor wafer 300 according to an embodiment of the invention. The semiconductor wafer 300 includes a plurality of fields, such as the field 302, and the fields 304. All of the fields preferably correspond to individual semiconductor dies or devices. The fields are separated from one another by scribe lines, or lanes, in one embodiment of the invention. The fields 304 are alignment fields, used for alignment purposes when photolithography is performed relative to the semiconductor wafer 300, as can be appreciated by those of ordinary skill within the art. There is preferably between two and four such fields 304 on the wafer 300. In the embodiment shown in FIG. 3, there are two such fields 304.

Figure 4:
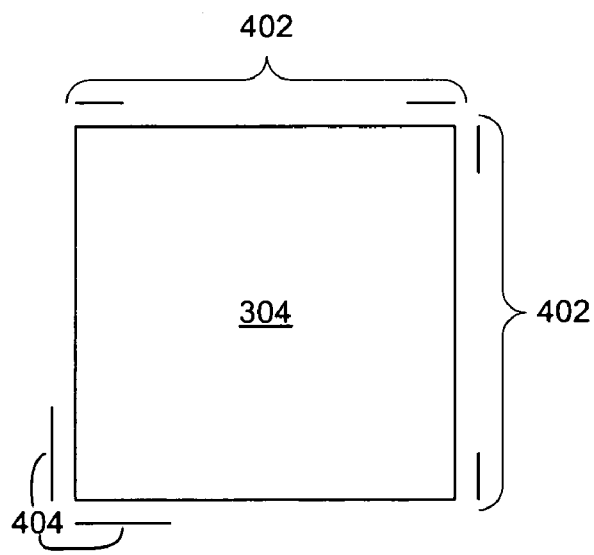
FIG. 4 is a diagram of one of the alignment fields of the semiconductor wafer of FIG. 3, in which pairs of intra-field small scribe lane primary mark (SSPM) overlay alignment marks have been added to provide for in-situ, non-passive intra-field alignment correction, according to an embodiment of the invention.

FIG. 4 shows a field 304 in more detail, according to an embodiment of the invention. The field 304 includes alignment marks 402, and alignment marks 404. The alignment marks 402 are intra-field small scribe lane primary mark (SSPM) overlay alignment marks, arranged in pairs. Together with mark 404, these allow for in-situ, non-passive intra-field alignment correction. In the embodiment shown in FIG. 4, there are two such pairs of alignment marks 402. The alignment marks 402 may be considered a pair of extra scribe lines or lanes, such that they can be defined on the semiconductor wafer of which the field 304 is a part in the same manner as such scribe lines or lanes are defined, in one embodiment of the invention. Furthermore, the alignment marks 404 are scribe lane primary mark (SPM) marks, and are arranged as a single pair. SSPM is one type of SPM.

The presence of the SSPM alignment marks 402 around the alignment field 304 allows for in-situ, non-passive intra-field alignment correction to take place during photolithography. That is, the addition of the SSPM alignment marks 402, besides the more general SPM alignment marks 404, allows for the correction of intra-field overlay errors, as have been described in the background section. The SSPM alignment marks 402 allow for such correction to be accomplished in an active, in-situ manner, in that the more time-consuming, and thus more costly, passive feed-forward process is not needed. Thus, the SSPM alignment marks 402 contribute to the advantages of the invention described in the summary section.

Figure 5:
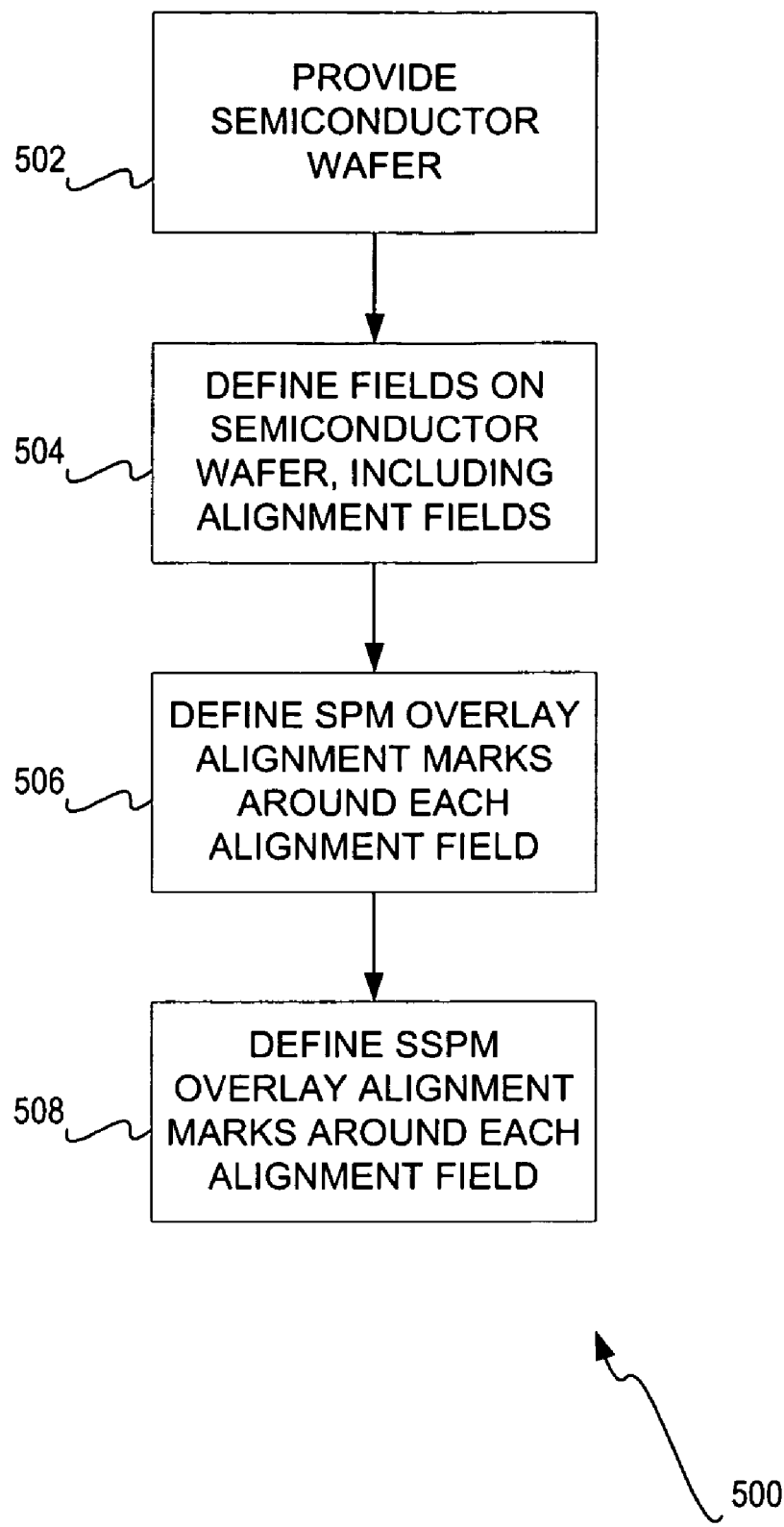
FIG. 5 is a flowchart of a method according to an embodiment of the invention.

FIG. 5 shows a method 500 according to an embodiment of the invention. A semiconductor wafer is provided (502). A number of fields are defined on the semiconductor wafer, including a number of alignment fields (504). A number of SPM overlay alignment marks are defined around each alignment field (506), such as one pair of SPM marks. Finally, a number of SSPM overlay alignment marks are also defined around each alignment field (508). In one embodiment, there may be between two and four pairs of such SSPM marks.

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. Therefore, it is manifestly intended that this invention be limited only by the claims and equivalents thereof.

What is claimed is:

1. A semiconductor wafer comprising:
   a plurality of fields on the wafer;
   a plurality of alignment fields within the plurality of fields, each alignment field having a plurality of intra-field overlay alignment mark pairs therearound for in-situ, non-passive intra-field alignment correction; and,
   a plurality of extra scribe-lane mark pairs around each of the plurality of alignment fields.

2. The semiconductor wafer of claim 1, wherein the plurality of fields comprises the plurality of alignment fields correspond to semiconductor dies.

3. The semiconductor wafer of claim 1, wherein the plurality of fields comprises the plurality of alignment fields correspond to semiconductor devices.

4. The semiconductor wafer of claim 1, wherein the plurality of intra-field overlay alignment mark pairs numbers between two and four.

5. The method comprising:
   providing a semiconductor wafer;
   defining a plurality of fields on the semiconductor wafer, including a plurality of alignment fields;
   providing a plurality of intra-field overlay alignment mark pairs around each of the plurality of alignment fields to provide for non-passive intra-field alignment correction; and,
   providing a plurality of extra scribe-lane mark pairs around each of the plurality of alignment fields.

6. The method of claim 5, wherein providing the plurality of fields comprises providing a plurality of fields corresponding to semiconductor dies.

7. The method of claim 5, wherein providing the plurality of fields comprises providing a plurality of fields corresponding to semiconductor devices.

8. The method of claim 5, wherein providing the plurality of fields comprises providing between two and four of the plurality of alignment intra-fields.

9. The method of claim 5, wherein providing the plurality of intra-field overlay alignment mark pairs around each of the plurality of alignment fields comprises providing between two and four of the plurality of overlay alignment mark pairs around each of the plurality of alignment fields.

10. A semiconductor wafer comprising:
    a plurality of fields;
    a plurality of alignment fields within the plurality of fields, each alignment field having 2–4 pairs of intra-field overlay alignment mark pairs there around for in-situ, non-passive intra-field alignment correction; and,
    a plurality of extra scribe-lane marks around each of the plurality of alignment fields.

11. The semiconductor wafer of claim 10, wherein the plurality of fields comprising the pair of alignment fields correspond to semiconductor dies.

12. The semiconductor wafer of claim 10, wherein the plurality of fields comprising the pair of alignment fields correspond to semiconductor devices.

* * * * *